(12) United States Patent                    (10) Patent No.:     US 7,675,286 B2
     Hosomi et al.                           (45) Date of Patent:     Mar. 9, 2010

(54) MAGNETORESISTIVE SENSOR DEVICE

(75) Inventors: Shinichi Hosomi, Tokyo (JP); Hirobumi Matsui, Tokyo (JP); Yuichi Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/778,336

(22) Filed: Jul. 16, 2007

(65) Prior Publication Data

US 2008/0218163 A1    Sep. 11, 2008

(30) Foreign Application Priority Data

Mar. 9, 2007    (JP) .............................. 2007-060011

(51) Int. Cl.
    *G01R 33/02*    (2006.01)
    *G01R 33/06*    (2006.01)
(52) U.S. Cl. .................................. 324/252; 324/207.21
(58) Field of Classification Search ................. 324/282, 324/174, 207.21, 207.25, 252, 262; 428/692, 428/693; 338/32 R; 365/158, 232; 360/313; 257/421, 427

See application file for complete search history.

(56) References Cited

U.S. PATENT DOCUMENTS 7,114,240 B2 * 10/2006 Baseman et al. ......... 29/603.15

FOREIGN PATENT DOCUMENTS

| DE | 40 13 449 C2 | 12/1990 |
| DE | 198 54 713 A1 | 11/1999 |
| DE | 199 22 136 A1 | 12/1999 |
| DE | 102 59 707 A1 | 12/2003 |
| DE | 10 2005 047 414 A1 | 8/2006 |
| DE | 10 2005 047 482 A1 | 4/2007 |
| EP | 0 326 293 A1 | 8/1989 |
| JP | 3626469 B2 | 12/2004 |
| JP | 2005-183472 A | 7/2005 |
| JP | 2005-285904 | 10/2005 |

OTHER PUBLICATIONS

Japanese Office Action dated Jan. 20, 2009 (2007-060011).

* cited by examiner

*Primary Examiner*—Reena Aurora
(74) *Attorney, Agent, or Firm*—Sughrue Mion, PLLC

(57) ABSTRACT

According to the present invention, a magnetoresistive sensor device, which can be manufactured at a high yield and a low cost, is excellent in magnetoresistance characteristics and is reliable can be provided. The magnetoresistive sensor device comprises a substrate, a signal processing circuit formed on the substrate, a flattening film for flattening the signal processing circuit, a silicon nitride film formed on the flattened signal processing circuit, and magnetoresistive sensor elements formed on the silicone nitride film, in which the flattening film is preferably a spin-on-glass (SOG) film.

3 Claims, 1 Drawing Sheet

MAGNETORESISTIVE SENSOR DEVICE

BACKGROUND OF THE INVENTION

1. Field of the Invention

The present invention relates to a magnetoresistive sensor device for detecting a change in a magnetic field induced by a moving body. More specifically, the present invention relates to a magnetoresistive sensor device which can be used as an on-vehicle sensor.

2. Description of the Related Art

As a magnetoresistive sensor device for detecting a change in a magnetic field induced by a moving body, there is a magnetoresistive sensor device which has magnetoresistive sensor elements formed of a giant magnetoresistive thin film formed on a signal processing circuit (integrated circuit: IC). As the giant magnetoresistive thin film in the magnetoresistive sensor device, an artificial lattice film comprising magnetic layers mainly containing Ni, Fe and Co alternately laminated with non-magnetic layers mainly containing Cu is used. In general, each of the magnetic layers and each of the non-magnetic layers of the artificial lattice film have a thickness of 10 to 25 Å, and the artificial lattice film is formed of 10 to 40 laminates, each including a magnetic layer and a non-magnetic layer. To match the lattice constant of the artificial lattice film with that of a surface of a base layer on which the artificial lattice film is to be formed, a buffer layer having a thickness of 10 to 80 Å is formed as the base layer for the artificial lattice film.

While the artificial lattice film having the laminate structure can achieve an extremely large magnetoresistance change rate of 20 to 30%, interaction between the very thin magnetic layer and the very thin non-magnetic layer is needed. Therefore, matching between the artificial lattice film and the base layer on which the artificial lattice film is to be formed becomes important. For example, an artificial lattice film formed directly on an IC having an uneven surface has a much lower magnetoresistance change rate than an artificial lattice film formed on a thermally oxidized film of a flat silicon wafer. When an artificial lattice film is formed on a flat oxidized film such as phosphorus silicate glass (PSG), if the PSG is left in the air for a long period of time before formation of the artificial lattice film, the surface state of the PSG is changed by the influence of moisture absorption or natural oxidation, which occurs on the surface of the PSG and the artificial lattice film formed on the surface of the PSG cannot achieve a satisfactory magnetoresistance change rate.

To cope with this, there is a magnetoresistive sensor device having a cured film of a special silicone polymer between an artificial lattice film and an IC (refer to JP 3626469 B, for example). This special silicone polymer can flatten the uneven surface pattern of the IC and match well with the artificial lattice film. Accordingly, the artificial lattice film formed on the cured film of the silicone polymer can achieve an excellent magnetoresistance change rate. Further, the magnetoresistive sensor device can achieve such high reliability that the magnetoresistive sensor can be used in an on-vehicle sensor by using an appropriate silicone polymer. To use the magnetoresistive sensor in an on-vehicle sensor, the magnetoresistive sensor device must retain an excellent magnetoresistance change rate even in a very severe environment such as a heat cycle endurance test in which the temperature amplitude is −40 to 140° C.

In JP 3626469 B the uneven pattern of the IC surface is flattened by applying a silicone polymer onto the uneven pattern of the surface of the IC. However, a silicone polymer having high reflowability (melt fluidity) must be selected to flatten the pattern completely. Therefore, the average molecular weight of the silicone polymer must be about 50,000 or less to ensure the reflowability of the silicone polymer.

When the ratio of an inorganic component in the silicone polymer is high, the brittleness of the cured film of the silicone polymer is increased. As a result, cracks are readily formed by stress in the cured film itself. The cured film must be made thin to suppress the formation of cracks, so the thickness of the cured film may be unsatisfactory to flatten the uneven surface pattern of the IC. Therefore, the content ratio of the inorganic component in the silicone polymer must be about 0.4 or less, that is, the content ratio of an organic component in the silicone polymer must be about 0.4 or more to ensure crack resistance.

Therefore, it has taken a great amount of time and labor to design a molecule of a silicone polymer which is excellent in both reflowability and crack resistance and which will match the magnetoresistive sensor elements well. As a result, the cost of a designed silicone polymer rises and a magnetoresistive sensor device cannot be manufactured at low cost.

When a silicone polymer which is excellent in both reflowability and crack resistance and which will match the magnetoresistive sensor elements well is not obtained, before the silicone polymer is applied to the uneven surface pattern of an IC, another material must be used to flatten the uneven surface pattern of the IC. That is, two or more different films must be interposed between the magnetoresistive sensor elements and the IC. In this case, as the silicone polymer does not need to have the reflowability, it is assumed that the degree of molecular design freedom increases and the cost of the silicone polymer slightly drops.

However, after the uneven surface pattern of the IC is flattened by a flattening film, the step of forming a cured film of the silicone polymer on the flattened IC is required. Therefore, the number of steps increases and long-time heat treatment is also needed for the reflow curing of the flattening film and the thermal curing of the silicone polymer. As a result, productivity thereof becomes low and the production cost thereof becomes high.

The cured film of the silicone polymer is a resin film. The surface of the cured film is oxidized and becomes inorganic when the cured film is exposed to oxygen plasma. As a result, the cured film becomes brittle and cracks are readily formed on the surface of the cured film. In a magnetoresistive sensor device having magnetoresistive sensor elements formed on the cured film of the oxidized silicone polymer, a satisfactory magnetoresistance change rate is not obtained. Therefore, in the step of etching the cured film of the silicone polymer (step of forming contact holes), it is difficult to use a photoresist film. This is because the step of ashing using oxygen plasma is generally required to remove the photoresist mask. When a metal mask is used, as the metal can be removed by wet etching, the oxidation of the surface of the cured film of the silicone polymer can be avoided but the number of production steps increases, thereby reducing productivity and boosting the production cost.

SUMMARY OF THE INVENTION

The present invention has been made to solve the above problems and it is an object of the present invention to provide a magnetoresistive sensor device, which can be manufactured at a high yield and a low cost, is excellent in magnetoresistance characteristics and is reliable.

The present invention provides a magnetoresistive sensor device comprising: a substrate; a signal processing circuit formed on the substrate; a flattening film for flattening the signal processing circuit; a silicon nitride film formed on the flattened signal processing circuit; and magnetoresistive sensor elements formed on the silicon nitride film.

According to the present invention, a magnetoresistive sensor device, which can be manufactured at a high yield and a low cost, was excellent magnetoresistance characteristics and is reliable can be provided by flattening the uneven surface pattern of an IC with a flattening film and forming a silicon nitride film on the flattened IC.

DESCRIPTION OF THE PREFERRED EMBODIMENTS

Embodiment 1

Figure 1:
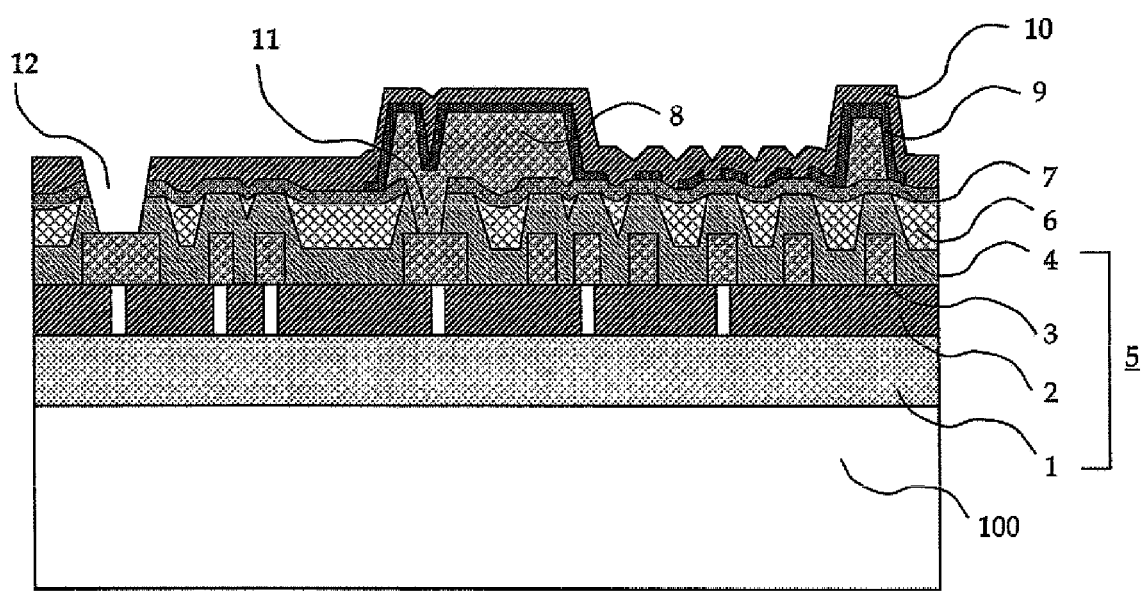
FIG. 1 is a sectional view of a magnetoresistive sensor device according to an embodiment of the present invention.

FIG. 1 is a sectional view of a magnetoresistive sensor device according to an embodiment of the present invention. The magnetoresistive sensor device of this embodiment comprises a substrate 100, a signal processing circuit (integrated circuit: IC) 5 formed on the substrate 100, a flattening film 6 for flattening the uneven surface pattern of the IC 5, a silicon nitride film 7 formed on the flattened IC 5 and magnetoresistive sensor elements 9 consisting of a magnetoresistive thin film formed on the silicon nitride film 7. In FIG. 1, the flattening film 6 is formed only in the recessed portions of the uneven surface pattern of the IC 5. It may also be formed to cover an entire uneven surface pattern of the IC 5. A protective film 10 is formed on the magnetoresistive sensor elements 9 and the silicon nitride film 7. The IC 5 is formed of a circuit portion 1, an interlayer insulating layer 2 formed on the circuit portion 1, a first wiring 3 formed on the interlayer insulating layer 2 and an IC protective film 4 formed on the interlayer insulating layer 2 and the first wiring 3. The IC 5 and the magnetoresistive sensor elements 9 are electrically connected to each other by second wiring 8 through contact holes 11 formed in the protective film 4, the flattening film 6 and the silicon nitride film 7. Pad portions 12 from which a part of the first wiring 3 is exposed are formed for connection with an external circuit.

Description is subsequently given of a process of manufacturing the magnetoresistive sensor device of this embodiment.

After the IC 5 is formed on the substrate 100, the flattening film 6 for flattening the uneven surface pattern of the IC 5 is formed. The material used to form the flattening film is not particularly limited if it can be used as a flattening material in this technical field, and boron phosphorus doped silicate glass (BPSG) or spin-on-glass (SOG) may be used, for example. Out of these, SOG which is excellent in the filling of recesses on the surface of the IC 5 and has high film hardness is preferably used. The IC 5 is not particularly limited if it is used in a magnetoresistive sensor device.

The flattening film 6 can be formed by applying the above flattening material to the uneven surface pattern of the IC 5 to flatten the uneven pattern and thermally curing it. A method of applying the flattening material is not particularly limited if it is known in this technical field. For example, CVD or spin coating may be used. Among them, spin coating is preferred from the viewpoint of productivity. Since thermal curing conditions (time, temperature, etc.) are changed by a type of the flattening material in use, they may be suitably set according to the type of the flattening material.

The silicon nitride film 7 can be formed on the IC 5 flattened with the flattening film 6 by sputtering, deposition or molecular beam epitaxy (MBE). When these techniques are used, the silicon nitride film 7 can be formed without heating at a high temperature. Among these techniques, sputtering is preferred, and in particular, reactive sputtering for growing a reaction product of nitrogen gas and silicon which is a target material is more preferred from the viewpoint of productivity.

Preferably, conditions for forming the silicon nitride film 7 are suitably set such that stress of the silicon nitride film 7 is made small in order to suppress the stress applied to the magnetoresistive sensor elements 9 formed on the silicon nitride film 7 as much as possible. More specifically, the gas pressure at the time of sputtering is adjusted to ensure $-1.0 \times 10^8$ N/m$^2 \leq$ film stress $\sigma \leq 1.0 \times 10^8$ N/m$^2$. The thickness of the silicon nitride film 7 is preferably set to 0.3 to 0.7 µm.

Since the silicon nitride film 7 can be easily formed by sputtering, long heat treatment is not necessary unlike the cured film of the silicone polymer. Further, as the silicon nitride film 7 is made of an inorganic material and not oxidized even when it is exposed to oxygen plasma, a photoresist mask can be used to etch the silicon nitride film 7 in a step of forming the contact holes 11. Therefore, as compared with a case where the cured film of the conventional expensive silicone polymer is used, a magnetoresistive sensor device can be manufactured at a high yield and at a low cost.

Since the silicon nitride film 7 is made of an inorganic material, as compared with the cured film of the conventional silicone polymer, it has high film hardness and is excellent as a protective layer for suppressing the moisture absorption of the flattening film such as a SOG film which is moisture absorptive, thereby enhancing the reliability of the obtained magnetoresistive sensor device.

The contact holes 11 can be formed in a desired pattern by dry etching after the silicon nitride film 7 is masked with photoresist. The dry etching is not particularly limited but reactive ion etching or ion beam etching may be employed.

The photoresist used for masking can be removed by ashing using oxygen plasma.

The second wiring 8 can be formed in a desired pattern by forming an aluminum film on the silicon nitride film 7 from which a part of the first wiring 3 is exposed through the contact holes 11 and masking the aluminum film with the photoresist to etch it. Since the second wiring 8 is directly connected to the first wiring 3 through the contact holes 11, before the second wiring 8 is formed, an oxidized film on the surface of the first wiring 3 in the contact holes 11 is desirably removed by reverse sputtering.

The method of forming the aluminum film is not particularly limited and sputtering, deposition and molecular beam epitaxy (MBE) may be used. Among them, sputtering is preferred from the viewpoint of productivity. As means of etching the aluminum film, wet etching is preferably used because the end face of the wiring pattern is tapered to make better connection between the second wiring 8 and the magnetoresistive sensor elements 9 when the second wiring 8 is formed.

In the above embodiment, aluminum is used as the material of the second wiring 8. Besides aluminum, the same conventionally known materials as those of the first wiring 3 of the IC 5 can be used. More specifically, AlSi, AlSiCu and AlCu all of which mainly contain Al, and Cu may be used as the material of the second wiring 8. The photoresist used for masking can be removed by ashing using oxygen plasma.

The magnetoresistive sensor elements 9 can be formed on the silicon nitride film 7 and the second wiring 8 by sputtering, deposition or molecular beam epitaxy (MBE). Among them, sputtering is preferred from the viewpoint of the magnetoresistive sensor element 9 properties and productivity.

The magnetoresistive elements 9 are formed of a magnetoresistive thin film. The magnetoresistive thin film is preferably an artificial lattice film formed by laminating magnetic layers alternately with non-magnetic layers. To match the lattice constant of a base layer on which the artificial lattice film is to be formed with the lattice constant of the artificial lattice film, a buffer layer having a thickness of 10 to 80 Å is preferably formed as the base layer of the artificial lattice film on the silicon nitride film 7 and the second wiring 8.

A conventionally known artificial lattice film may be used as the artificial lattice film. More specifically, an artificial lattice film formed by laminating magnetic layers mainly containing Ni, Fe and Co alternately with non-magnetic layers mainly containing Cu may be used. In general, each of the magnetic layers and each of the non-magnetic layers of the artificial lattice film have a thickness of 10 to 25 Å, and the artificial lattice film is formed of 10 to 40 laminates, each including a magnetic layer and a non-magnetic layer.

To obtain magnetoresistive sensor elements 9 having a desired pattern, after the magnetoresistive thin film is masked with photoresist having a desired element pattern, etching may be carried out. Dry etching is preferred from the viewpoint of dimensional accuracy.

The photoresist used for masking can be removed by ashing using oxygen plasma.

The protective film 10 can be formed on the silicon nitride film 7 on which the magnetoresistive sensor elements 9 have been formed by sputtering, deposition or molecular beam epitaxy (MBE). The material which can be used in the protective film 10 is not particularly limited and a material conventionally known in this technical field may be used. Examples of the material which can be used in the protective film 10 include inorganic materials such as glass and silicon nitride.

Since the silicon nitride film 7 is the base layer of the magnetoresistive sensor elements 9 in the embodiment of the present invention, when a silicon nitride film is used as the protective film 10, the apparatus can be shared to form these films, thereby making it possible to cut the production cost. Further, when a silicon nitride film is used as the protective film 10, the magnetoresistive sensor device is superior in reliability. That is, as the magnetoresistive sensor elements 9 are sandwiched between the silicon nitride film 7 and the protective film 10, the thermal expansion coefficients of the upper layers and underlying layers of the magnetoresistive sensor elements 9 become almost the same even when there is a temperature change in the outside environment, thereby reducing stress generated by differences in thermal expansion and making disconnections and changes in properties difficult to occur.

The thickness of the protective film 10 is not particularly limited but is generally 0.5 to 1.0 μm.

After the protective film 10 is formed, a heat treatment is preferably carried out to stabilize the properties of the magnetoresistive sensor elements 9. Preferably, the heat treatment is generally carried out at 200 to 270° C. for 3 hours or longer.

The pad portions 12 can be formed in a desired pattern by dry etching after the protective film 10 is masked with photoresist. The dry etching is not particularly limited but reactive ion etching or ion beam etching may be employed.

The photoresist used for masking can be removed by ashing using oxygen plasma.

EXAMPLES

The following examples are provided for the purpose of further illustrating the present invention but are in no way to be taken as limiting.

Example 1

A magnetoresistive sensor device of Example 1 was manufactured as follows.

SOG was first applied to the uneven portions of an IC formed on a substrate to a thickness of 0.3 μm by spin coating. Thereafter, the SOG was post-baked in an oven at 400° C. for 1 hour in a nitrogen atmosphere to be thermally cured so as to form a flattening film consisting of a SOG film.

Thereafter, a silicon nitride film having a thickness of 0.5 μm was formed on an IC flattened by the SOG film by reactive sputtering using silicon as a target material in a nitrogen atmosphere.

After the silicon nitride film was masked with photoresist, contact holes were formed by reactive ion etching using a $CF_4/O_2$ mixed gas. Thereafter, the photoresist used for masking was removed by ashing using oxygen plasma.

After an aluminum film having a thickness of 0.8 μm was formed on the silicon nitride film from which a part of the first wiring was exposed through the contact holes by sputtering, the aluminum film was masked with photoresist and wet etched to form a second wiring consisting of an aluminum film. Thereafter, the photoresist used for masking was removed by ashing using oxygen plasma to expose the silicon nitride film and the second wiring.

Thereafter, a buffer layer having a thickness of 50 to 80 Å was formed on the silicon nitride film and the second wiring by sputtering and a magnetoresistive thin film was formed on the buffer layer. The magnetoresistive thin film was formed by laminating magnetic layers made of $Fe_{(1-x)}Co_x$ ($x \geq 0.7$) alternately with non-magnetic layers made of Cu. Each of the magnetic layers of the magnetoresistive thin film had a thickness of 11 to 18 Å and each of the non-magnetic layers had a thickness of 19 to 23 Å, and the magnetoresistive thin film was formed of 20 laminates, each including a magnetic layer and a non-magnetic layer. The buffer layer was made of $Fe_{(1-x)}Co_x$ ($x \geq 0.7$) which is the same material as the magnetic layer.

After the magnetoresistive thin film was masked with photoresist, a predetermined element pattern was formed by dry etching. Thereafter, the photoresist used for masking was removed by ashing using oxygen plasma to expose the element pattern.

Thereafter, a protective film consisting of a 0.75 μm-thick silicon nitride film was formed on the element pattern by reactive sputtering using silicon as a target material in a nitrogen atmosphere.

After the protective film was masked with photoresist, pad portions from which a part of the first wiring was exposed to be connected to an external circuit were opened by dry etching. Thereafter, the photoresist used for masking was removed by ashing using oxygen plasma.

Comparative Example 1

In Comparative Example 1, a conventional magnetoresistive sensor device having the same structure as in Example 1 was manufactured except that the cured film of the conventional silicone polymer was formed in place of the silicon nitride film. The silicone polymer disclosed by JP 3626469 B was used as the conventional silicone polymer.

The magnetoresistive sensor device of Comparative Example 1 was manufactured as follows.

After the uneven surface pattern of an IC was flattened with SOG as in Example 1, the conventional silicone polymer was applied to SOG by spin coating and post-baked in an oven at 350° C. for 1 hour in a nitrogen atmosphere to form the cured film of the silicone polymer.

Thereafter, to form contact holes, a metal mask for dry etching was made. More specifically, an aluminum film was first formed on the cured film of the silicone polymer by sputtering and masked with photoresist, and unmasked portions of the aluminum film were removed by wet etching. Thereafter, the photoresist was removed by ashing using oxygen plasma to form the metal mask consisting of the aluminum film. The thickness of the above aluminum film was 1,250 Å.

Thereafter, contact holes were formed by reactive ion etching using a $CF_4/O_2$ mixed gas with the aluminum film as the metal mask like Example 1. The aluminum film was then removed by wet etching. The subsequent steps were the same as in Example 1.

As described above, a long-time heat treatment step is required to form the cured film of the silicone polymer in Comparative Example 1 whereas it is not required in Example 1 and the silicon nitride film can be easily and quickly formed by sputtering.

In Comparative Example 1, a large number of steps such as the aluminum film forming step, wet etching step and aluminum film removing step are required to prevent the surface of the cured film of the silicone polymer from being exposed to oxygen plasma when the contact holes are to be formed. In contrast to this, in Example 1, the silicon nitride film is made of an inorganic material and even when it is exposed to oxygen plasma, it is not oxidized. Therefore, after the silicon nitride film is masked with photoresist, the contact holes can be formed simply by dry etching.

Therefore, a magnetoresistive sensor device can be manufactured at a high yield and at a low cost in Example 1 as compared with Comparative Example 1.

When the magnetoresistance change rates of the magnetoresistive sensor devices of Example 1 and Comparative Example 1 were measured, it was confirmed that the magnetoresistive sensor device of Example 1 had the same magnetoresistance change rate as that of the magnetoresistive sensor device of Comparative Example 1. Even in the severe environment of a heat cycle endurance test in which the temperature amplitude is −40 to 140° C., an excellent magnetoresistance change rate could be maintained. Therefore, it can be said that the magnetoresistive sensor device of Example 1 is so reliable that it can be used as an on-vehicle sensor.

The magnetoresistive sensor device of the present invention can be manufactured at a high yield and at a low cost and has excellent magnetoresistance characteristics and reliability.

What is claimed is:

1. An on-vehicle magnetoresistive sensor device, comprising:
    a substrate;
    a signal processing circuit formed on the substrate;
    a flattening film for flattening the signal processing circuit;
    a silicon nitride film formed on the flattened signal processing circuit;
    magnetoresistive sensor elements formed on the silicon nitride film; and
    a protective layer consisting of a silicon nitride film formed on the magnetoresistive sensor elements,
    wherein a film stress of the silicon nitride film formed on the flattened signal processing circuit and a film stress of the silicon nitride film formed on the magnetoresistive sensor elements is between $-1.0 \times 10^8$ N/m$^2$ and $1.0 \times 10^8$ N/m$^2$.

2. The on-vehicle magnetoresistive sensor device according to claim 1, wherein the flattening film is a spin-on-glass (SOG) film.

3. The on-vehicle magnetoresistive sensor device according to claim 1, wherein the signal processing circuit includes a circuit portion formed on the substrate, an interlayer insulating layer formed on the circuit portion, a first wiring formed on the interlayer insulating layer and a protective film formed on the interlayer insulating layer and the first wiring.

* * * * *